(12) United States Patent
Chen et al.

(10) Patent No.: US 11,498,779 B2
(45) Date of Patent: Nov. 15, 2022

(54) ADSORPTION DEVICE, METHOD FOR MAKING SAME, AND TRANSFERRING SYSTEM HAVING SAME

(71) Applicant: Century Technology (Shenzhen) Corporation Limited, Shenzhen (CN)

(72) Inventors: Po-Liang Chen, New Taipei (TW); Yung-Fu Lin, New Taipei (TW); Hirohisa Tanaka, Neihu (TW); Yasunori Shimada, Neihu (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 653 days.

(21) Appl. No.: 16/546,591

(22) Filed: Aug. 21, 2019

(65) Prior Publication Data

US 2021/0002087 A1    Jan. 7, 2021

(30) Foreign Application Priority Data

Jul. 5, 2019  (CN) .......................... 201910604669.4

(51) Int. Cl.
*B65G 47/92* (2006.01)
*H01L 23/00* (2006.01)
*H01L 21/677* (2006.01)

(52) U.S. Cl.
CPC .............. *B65G 47/92* (2013.01); *H01L 24/75* (2013.01); *H01L 21/67709* (2013.01); *H01L 2224/75735* (2013.01); *H01L 2224/76735* (2013.01); *H01L 2224/77735* (2013.01); *H01L 2224/79735* (2013.01)

(58) Field of Classification Search
CPC . H01L 2224/75735; H01L 2224/77735; H01L 2224/79735; H01L 24/75; H01L 21/67709; B65G 47/92; H01F 7/0247; H01F 7/0257
See application file for complete search history.

(56) References Cited

U.S. PATENT DOCUMENTS

2018/0096977 A1    4/2018  Ahmed et al.
2021/0005488 A1*   1/2021  Chen ....................... H01L 33/00

FOREIGN PATENT DOCUMENTS

| CN | 106957798 A | 7/2017 | |
| CN | 109378370 A | 2/2019 | |
| TW | 368048 U | 8/1999 | |
| WO | WO-2019081045 A1 * | 5/2019 | ............. C23C 14/50 |

* cited by examiner

*Primary Examiner* — David A Zarneke
(74) *Attorney, Agent, or Firm* — ScienBiziP, P.C.

(57) ABSTRACT

A device to attract and hold microscopic items such as micro LEDs magnetically rather than by static electricity includes a substrate and a plurality of magnetic units on a surface of the substrate. The magnetic units are spaced apart from each other and are constrained in the size and direction of their individual magnetic fields. Each of the magnetic units includes a magnet and a cladding layer partially covering the magnet. The cladding layer is made of a magnetic material. A side of the magnet away from the substrate is exposed from the cladding layer to attract and hold one micro LED.

18 Claims, 10 Drawing Sheets

ADSORPTION DEVICE, METHOD FOR MAKING SAME, AND TRANSFERRING SYSTEM HAVING SAME

FIELD

The subject matter herein generally relates to a field of manufacturing display panels, and particularly relates to an adsorption device, a method for making the adsorption device, and a transferring system having the adsorption device.

BACKGROUND

In a manufacturing process of a micro light emitting diode (LED) display device, a large number of LEDs are transferred to a substrate having a circuit. A known method of transferring is to adopt electrostatic attraction, that is, the LEDs to be transferred are held to a transferring substrate by static electricity, then the transferring substrate with the LEDs is moved above the substrate, and the static electricity is removed to make the LEDs drop onto the substrate. However, the electrostatic charge may damage the circuit on the substrate.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
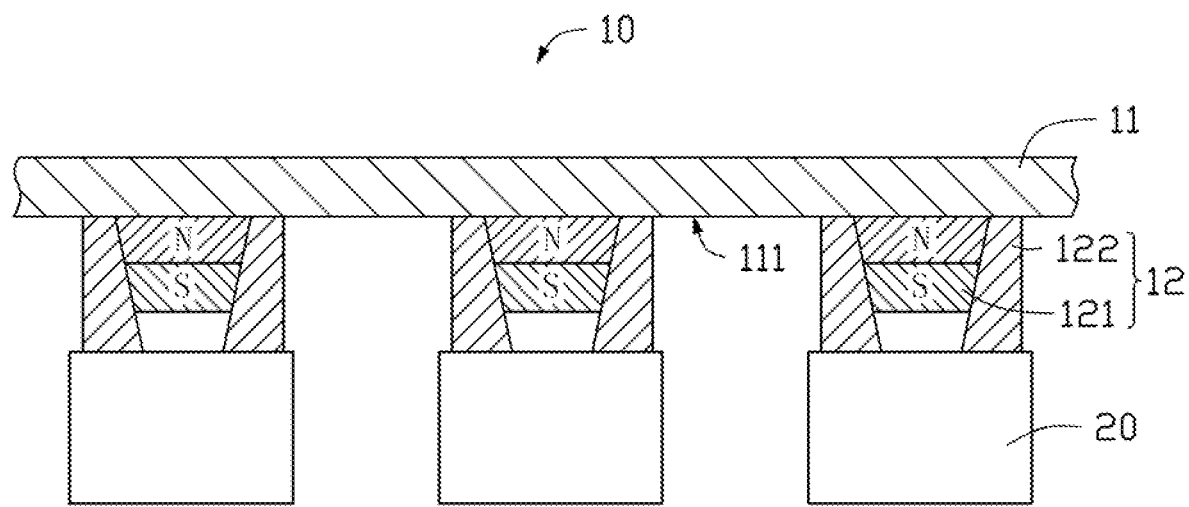
FIG. 1 is a cross-sectional view of an adsorption device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Referring to FIG. 1, an adsorption device provided in this embodiment is configured to attract and hold multiple target objects 20 by magnetic force. The adsorption device 10 includes a substrate 11 and a plurality of magnetic units 12 on the substrate 11.

The substrate 11 is made of a magnetic material, such as one or more selected from a group consisted of iron, cobalt, and nickel. Each magnetic unit 12 can generate a magnetic attraction to the substrate 11 such that the magnetic units 12 are firmly held on the substrate 11. In the present embodiment, the substrate 11 is an iron substrate having a substantially rectangular plate shape.

In this embodiment, the magnetic units 12 are located on a surface 111 of the substrate 11, and the magnetic units 12 are arranged in an array on the surface 111. In other embodiments, the magnetic units 12 can be arranged in other manner.

Each magnetic unit 12 includes a magnet 121 and a cladding layer 122 partially covering the magnet 121. The magnet 121 has two magnetic poles that are a magnetic pole S and a magnetic pole N. The cladding layer 122 is also made of a magnetic material. In this embodiment, the cladding layer 122 is made of a ferromagnetic material or a ferrimagnetic material, and specifically may be iron, cobalt, or nickel. In this embodiment, the cladding layer 122 and the substrate 11 are made of a same material.

Figure 2:
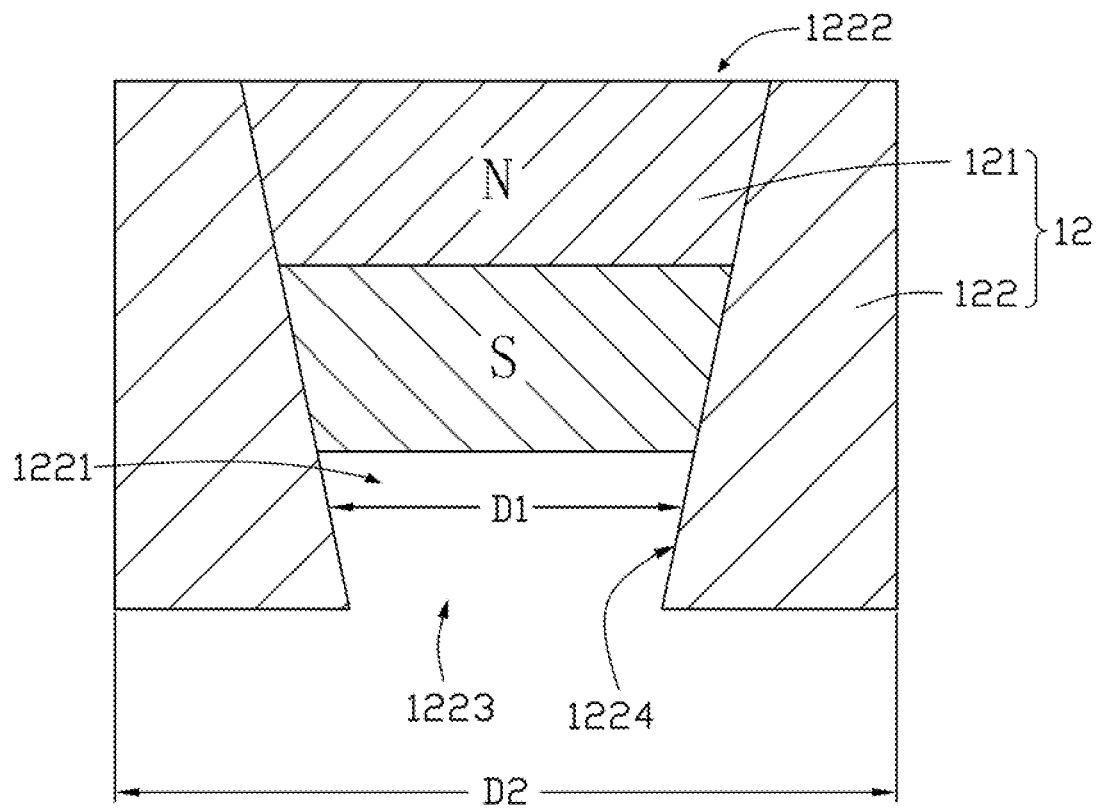
FIG. 2 is a cross-sectional view of a magnetic unit in the adsorption device of FIG. 1.

As shown in FIG. 2, in the embodiment, the cladding layer 122 defines a through hole 1221 extending through the cladding layer 122. The through hole 1221 has a first opening 1222, a second opening 1223 opposite to the first opening 122, and a sidewall 1224 coupling between the first opening 1222 and the second openings 1223. The magnet 121 is located in the through hole 1221. The magnet 121 has a shape which fits the through hole 1221 and the magnet 121 is in direct contact with the side wall 1224. The first opening 1222 is covered by the substrate 11 and the magnet 121 is in direct contact with the substrate 11. The magnet 121 is exposed from the cladding layer 122 by the second opening 1223. The magnetic pole S and the magnetic pole N of the magnet 121 are in a direction from the first opening 1222 to the second opening 1223. In this embodiment, the magnetic pole N is closer to the first opening 1222 (substrate 11), and the magnetic pole S pole is closer to the second opening 1223. There is an empty space in the through hole 1221 when the magnet 121 is in the through hole 1221.

As shown in FIG. 1 and FIG. 2, in this embodiment, an inner diameter D1 of the through hole 1221 gradually decreases from the first opening 1222 adjacent to the substrate 11 to the second opening 1223 away from the substrate 11. That is, the inner diameter D1 at the first opening 1222 is the greatest in size, and the inner diameter D1 at the second opening 1223 is the smallest. The magnet 121 has an outer diameter which gradually increases. The design of the inner diameter D1 allows the magnet 121 to be fixed in the through hole 1221 of the cladding layer 122 and be not easily detachable from the through hole 1221. In the present embodiment, the inner diameter D1 of the through hole 1221 gradually changes, but the outer diameter D2 of the cladding layer 122 is constant and equal to 40 µm.

It can be understood that the inner diameter D1 of the through hole 1221 at the second opening 1223 is less than an outer diameter of a side of the magnet 121 adjacent to the second opening 1223, which prevents the magnet 121 slipping from the through hole 1221.

Figure 3:
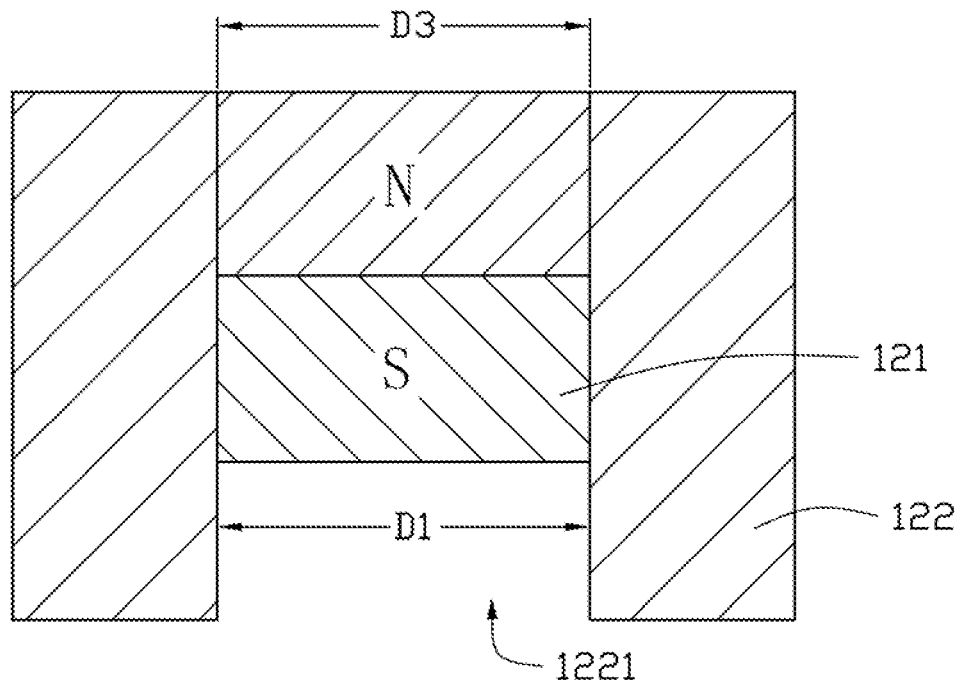
FIG. 3 is a cross-sectional view of a magnetic unit according to a modified embodiment of the present disclosure.

As shown in FIG. 3, in a modified embodiment, the inner diameter D1 of the through hole 1221 is constant, and an outer diameter D3 of the magnet 121 is slight less than the inner diameter D1 of the through hole 1221, such that the magnet 121 can be fixed in the through hole 1221 of the cladding layer 122. Alternatively, in other embodiments, the magnet 121 may be adhesively fixed in the through hole 1221.

As shown in FIG. 1, since the magnet 121 in the adsorption device 10 is partially covered by the cladding layer 122 and the cladding layer 122 is a ferromagnetic material, the magnetic lines of the magnet 121 are constrained to be within the cladding layer 122, the adsorption device 10 generates a substantially concentrated magnetic force only at positions where each magnetic unit 12 is located. Moreover, the cladding layer 122 also prevents the magnetic force between adjacent magnetic units 12 from affecting each other. The adsorption device 10 is able to function because the magnetic properties are generated only at specific positions of the substrate 11 (positions of the magnetic units 12) instead of across the entire substrate 11. The magnetic units 12 located on the substrate 11 can hold many target objects 20 at one time.

Moreover, since each magnetic unit 12 is fixed to the substrate 11 by magnetic force, the magnetic unit 12 can be removed from the substrate 11 without causing damage to the magnetic unit 12 or the substrate 11. The number of magnetic units 12 on the substrate 11 and a positional relationship between the magnetic units 12 can be adjusted according to actual needs, which allows flexibility in employing the adsorption device 10.

Figure 4:
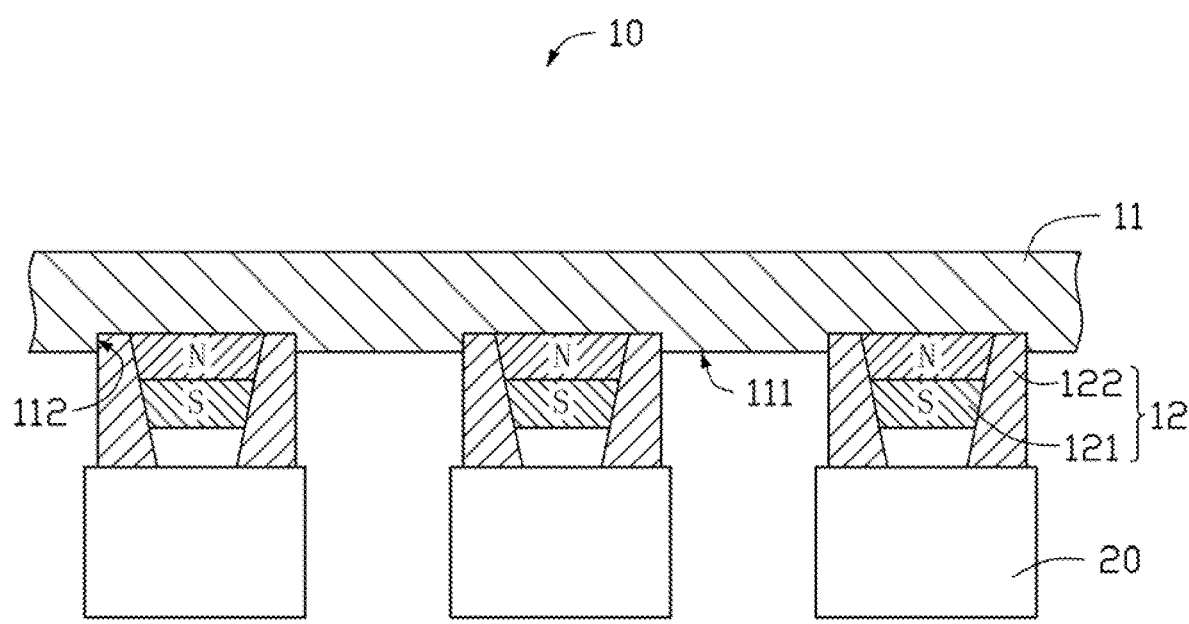
FIG. 4 is a cross-sectional view of an adsorption device according to another embodiment of the present disclosure.

Referring to FIG. 4, in another embodiment, the surface 111 of the substrate 11 defines a plurality of recesses 112 spaced apart from each other. Each recess 112 corresponds to one magnetic unit 12, and each magnetic unit 12 is located in one of the recesses 112. In this embodiment, only a portion of the magnetic unit 12 is received in the recess 112. The manner in which the substrate 11 defines the recess 112 facilitates positioning of each magnetic unit 12 on the substrate 11.

Figure 5:
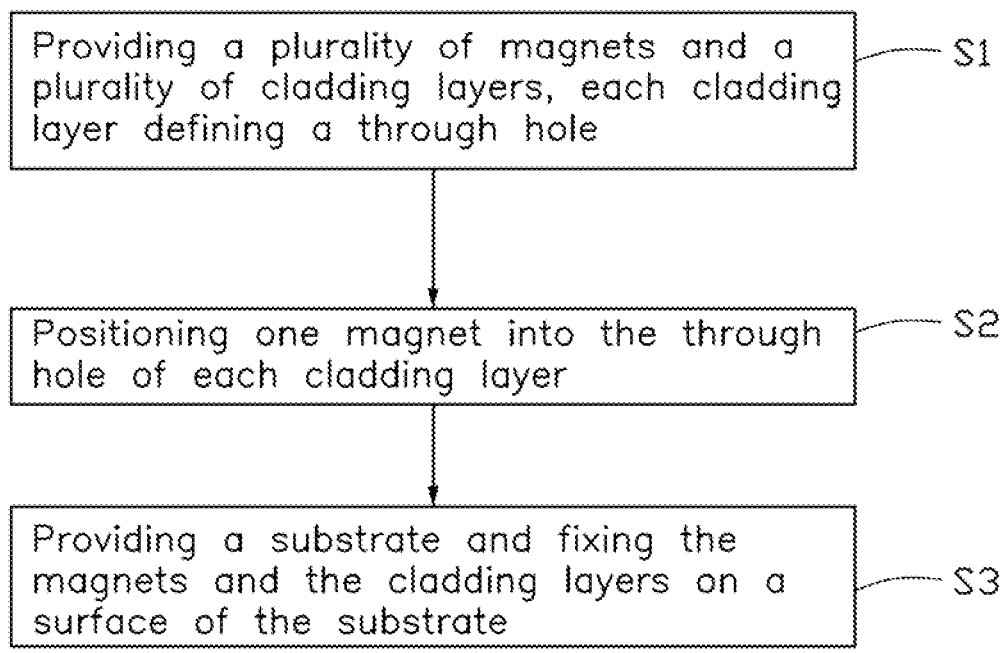
FIG. 5 is a flowchart showing a method for making the adsorption device.

FIG. 5 illustrates a flowchart of a method for making an adsorption device. The example method is provided by way of example, as there are a variety of ways to carry out the method. Each block shown in FIG. 5 represents one or more processes, methods, or subroutines, carried out in the exemplary method. Furthermore, the illustrated order of blocks is by example only and the order of the blocks can change. The exemplary method can begin at block S1 according to the present disclosure. Depending on the embodiment, additional steps can be added, others removed, and the ordering of the steps can be changed.

At block S1: a plurality of magnets and a plurality of cladding layers are provided.

Each of the cladding layers defines a through hole extending through the cladding layer. The through hole has a shape and a size such that the magnet cannot escape from the through hole. Each of the cladding layers is made of a ferromagnetic material.

At block S2, one of the magnets is positioned into the through hole of each cladding layer.

Figure 6:
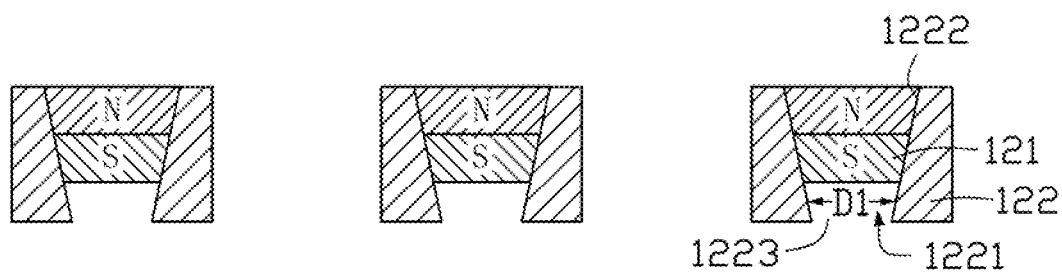
FIG. 6 is a cross-sectional view illustrating a step S2 of the method for making the adsorption device in FIG. 5.

As shown in FIG. 6, the through hole 1221 of each cladding layer 122 has a first opening 1222 and a second opening 1223 opposite to the first opening 1222. An inner diameter D1 of the through hole 1221 gradually changes. In this embodiment, an inner diameter D1 of the through hole 1221 at the first opening 1222 is greater than an inner diameter D1 of the through hole 1221 at the second opening 1223, and the magnet 121 is inserted into the through hole 1221 from the first opening 1222. In other embodiments, the inner diameter D1 of the through hole 1221 can be constant.

At block S3, a substrate is provided, and the magnet and the cladding layer are fixed on a surface of the substrate in such a manner that the substrate covers one of the openings of the through holes of each of the cladding layers.

Figure 7:
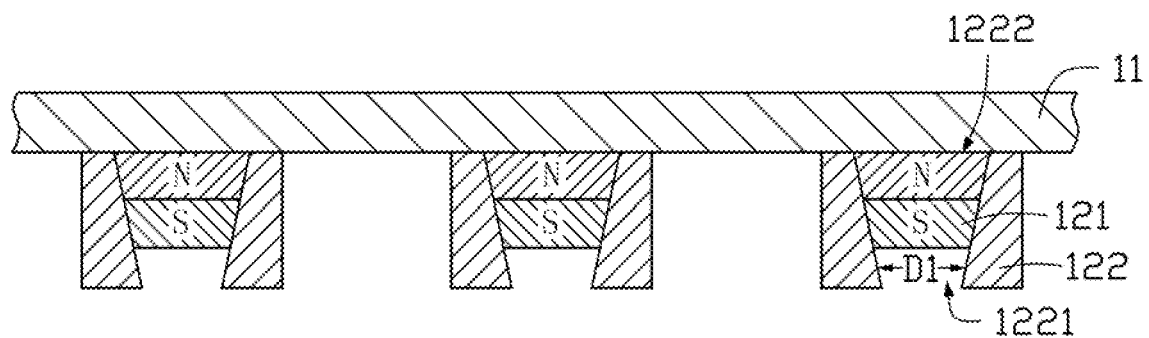
FIG. 7 is a cross-sectional view illustrating a step S3 of the method for making the adsorption device in FIG. 5.

As shown in FIG. 7, the substrate 11 closes the first opening 1222 of the through hole 1221. In one embodiment, the substrate 11 is made of a magnetic material. In other embodiment, the substrate 11 is made of a non-magnetic material.

Figure 8:
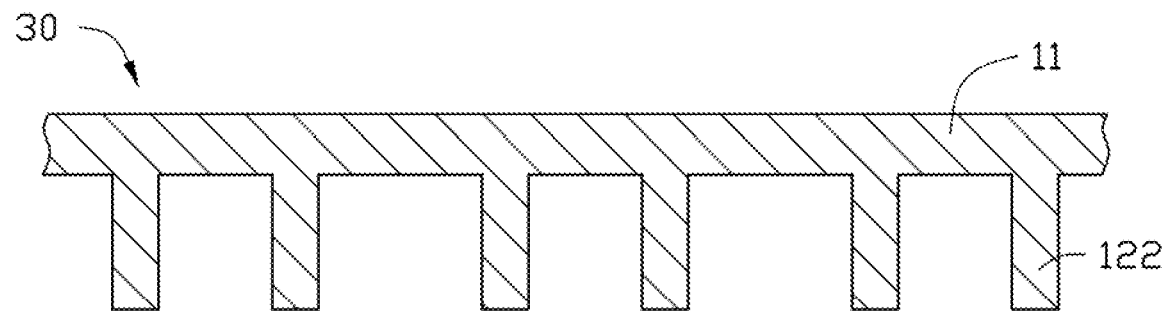
FIG. 8 is a cross-sectional view showing the adsorption device in a method for making the adsorption device.
Figure 9:
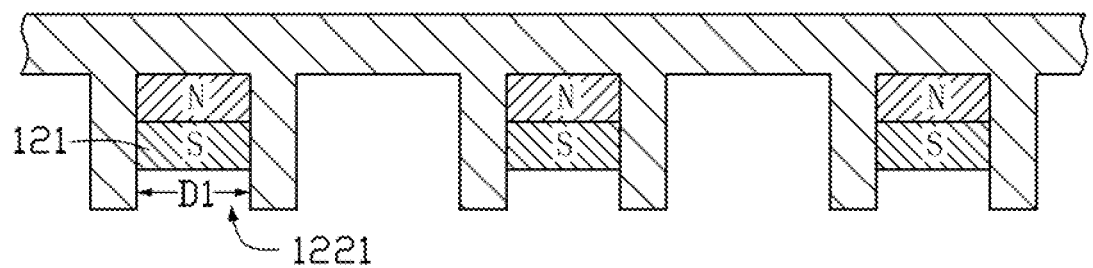
FIG. 9 is a cross-sectional view showing the adsorption device in a method for making the adsorption device.

In one embodiment, the substrate 11 and the cladding layers 122 are formed integrally. As shown in FIG. 8, a mother board 30 is provided. The mother board 30 is etched to form a substrate 11 and a plurality of cladding layers 122 coupling to the substrate 11. Each cladding layer 122 defines a through hole 1221 coupling to the substrate 11. The through hole 1221 has a constant inner diameter D. As shown in FIG. 9, one magnet 121 is placed in each through hole 1221.

Figure 10:
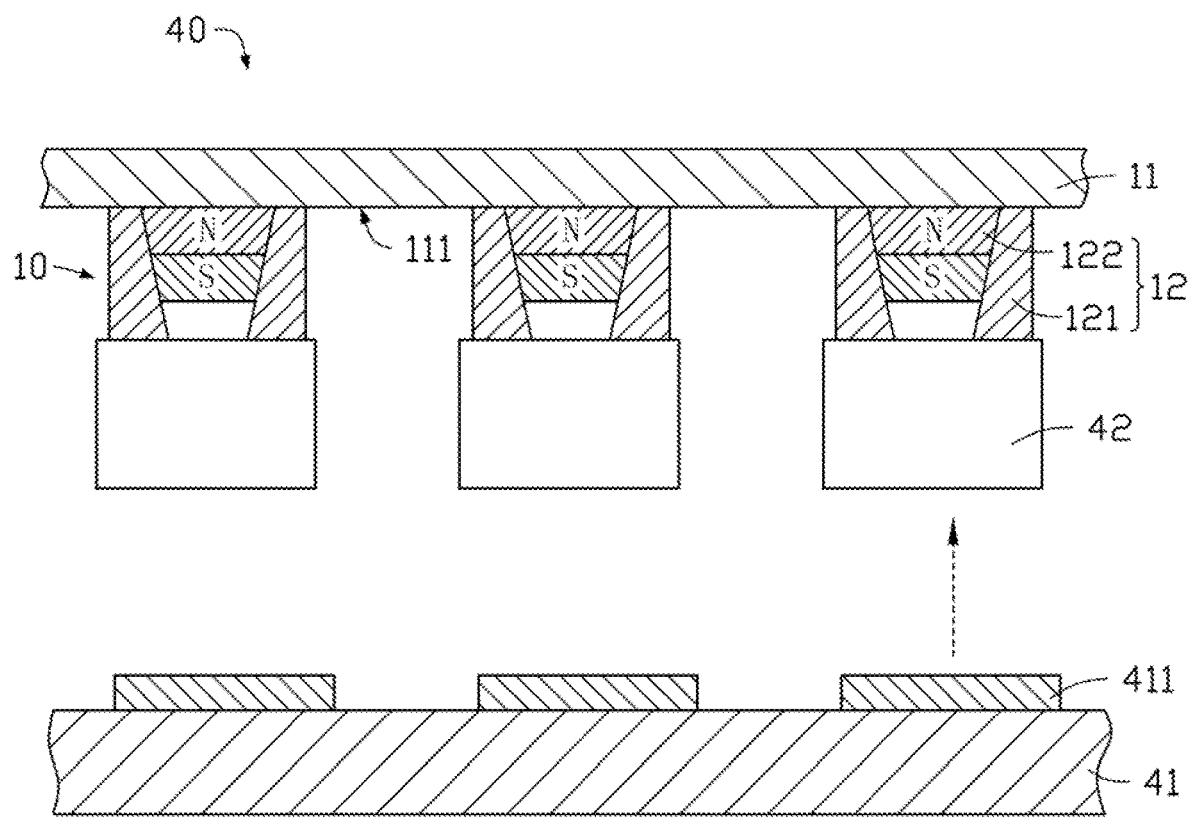
FIG. 10 is a cross-sectional view of a transferring system according to an embodiment of the present disclosure.

As shown in FIG. 10, a transferring system 40 includes the adsorption device 10 and a target substrate 41. In this embodiment, the transferring system 40 is used to complete a massive transferring of the LEDs 42 during a manufacturing process of the display panel. The transferring system 40 is used to simultaneously transfer a large number of LEDs 42 in a single operation.

In this embodiment, the target substrate 41 is an active substrate/array substrate of a display panel. The target substrate 41 defines a plurality of pixel regions, and each of the magnetic units 12 corresponds to one of the pixel regions. An anisotropic conductive adhesive 411 is arranged in an array of spots on the target substrate 41, and each spot of anisotropic conductive adhesive 411 is located in one pixel region. The LED 42 can be, for example, a mini LED, a micro LED, and a conventional size LED. The mini LED described herein refers to a sub-millimeter-level LED having a size of about 100 µm to 200 µm or more; a micro LED refers to an LED having a size of 100 µm or less.

A working process of the transferring system 40 is as follows.

As shown in FIG. 10, a surface 111 of the substrate 11 having the magnetic units 12 faces the LEDs 42. The LED 42 is made of a material having magnetic properties or contains magnetic particles, and the LEDs 42 have a magnetic property that is different from that of the magnetic pole of the magnet 121 away from the substrate 11. Thus, the LED 42 is subjected to a magnetic force in a direction toward the adsorption device 10 (see arrow shown in FIG. 10) and is attracted by the magnetic unit 12. Since the magnetic units 12 are formed on the substrate 11 and each magnetic unit 12 can attract only one LED 42, the adsorption device 10 can adsorb a large number of LEDs 42 at a single time. In a manufacturing process of the display panel, the adsorption device 10 can attract and hold tens of thousands of LEDs 42.

Figure 11:
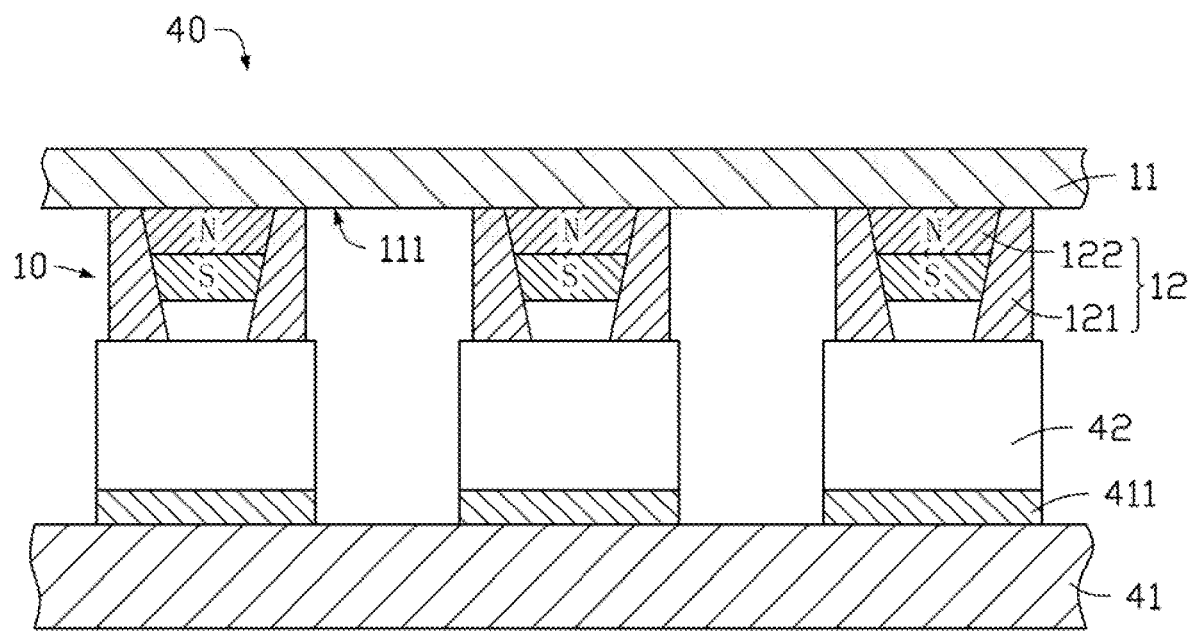
FIG. 11 is a cross-sectional view showing the transferring system of FIG. 10 in a working state.

As shown in FIG. 11, the adsorption device 10 can be moved above the target substrate 41 or the target substrate 41 can be moved under the adsorption device 10, and the LEDs 42 attracted by the adsorption device 10 are in one-to-one correspondence with the spots of anisotropic conductive adhesive 411 on the target substrate 41. Each LED 42 contacts one spot of anisotropic conductive adhesive 411. Further, the spots of anisotropic conductive adhesive 411 are thermally cured or UV-cured so that the LEDs 42 are adhered to the anisotropic conductive adhesive 411 in one-to-one correspondence.

Figure 12:
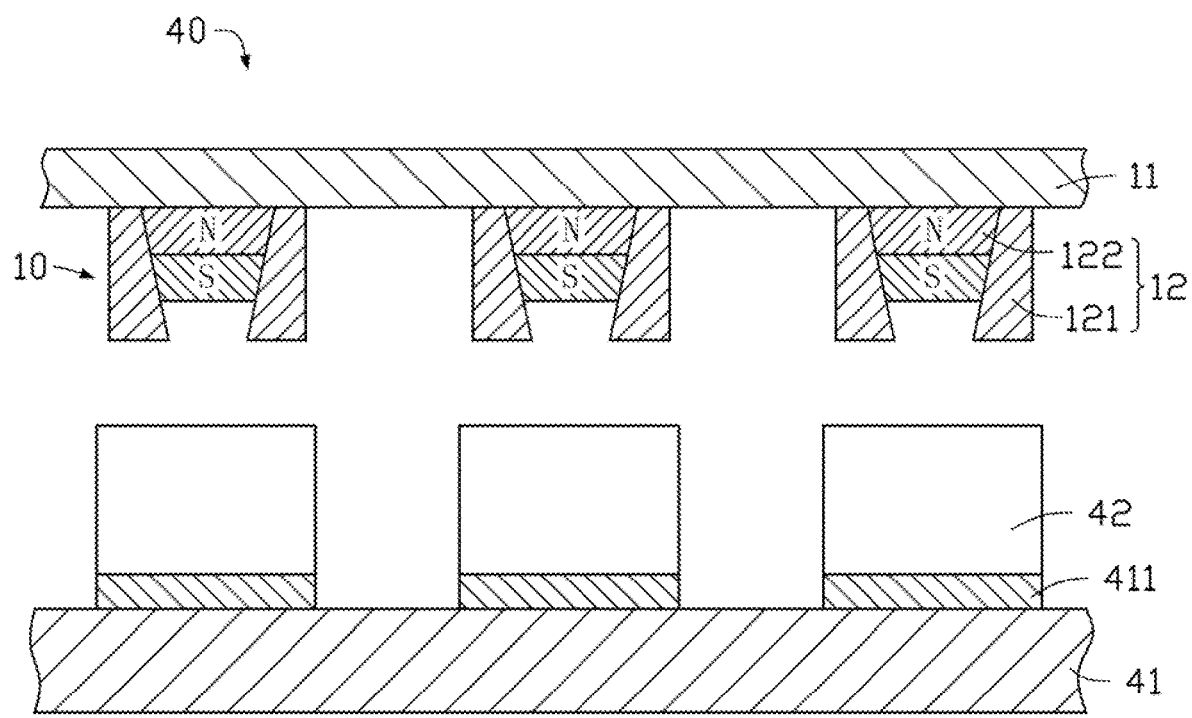
FIG. 12 is a cross-sectional view showing the transferring system of FIG. 10 in a working state.

As shown in FIG. 12, an adhesion force between the LED 42 and the anisotropic conductive adhesive 411 is greater than the magnetic attraction of the LED 42 to the adsorption device 10. When the adsorption device 10 is moved away from the target substrate 41, the LED 42 will be separated from the adsorption device 10 and fixed to the target substrate 41.

As described above, the large number of LEDs 42 can be transferred onto the target substrate 41 at one time. Particularly, when the size of the LED 42 is small (such as mini LEDs and Micro LEDs), the above transferring system 40 facilitates manufacturing efficiency in relation to the display panel.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An adsorption device, comprising:
   a substrate; and
   a plurality of magnetic units on a surface of the substrate, the plurality of magnetic units being spaced apart from each other;
   wherein each of the plurality of magnetic units comprises a magnet and a cladding layer partially covering the magnet;
   the cladding layer is made of a magnetic material; and
   a side of the magnet away from the substrate is exposed from the cladding layer.

2. The adsorption device of claim 1, wherein the cladding layer defines a through hole; the though hole extends through the cladding layer; the through hole comprises a first opening and a second opening opposite to the first opening; the magnet is in the through hole; the substrate covers one of the first opening and the second opening.

3. The adsorption device of claim 2, wherein an inner diameter of the through hole gradually decreases from the first opening to the second opening; the substrate covers the first opening.

4. The adsorption device of claim 3, wherein an outer diameter of the magnet gradually decreases in a direction from the first opening to the second opening to fit the through hole.

5. The adsorption device of claim 2, wherein an inner diameter of the through hole is constant from the first opening to the second opening.

6. The adsorption device of claim 2, wherein the magnet comprises a magnetic pole S and a magnetic pole N, one of the magnetic pole S and the magnetic pole N is closer to the first opening, and other of the magnetic pole S and the magnetic pole N is closer to the second opening.

7. The adsorption device of claim 1, wherein the cladding layer is made of one or more selected from a group consisted of iron, cobalt, and nickel.

8. The adsorption device of claim 1, wherein the cladding layer and the substrate are made of a same material.

9. The adsorption device of claim 1, wherein the surface of the substrate defines a plurality of recesses spaced apart from each other; each of the plurality of magnetic units is located in one of the plurality of recesses.

10. A transferring system, comprising:
    a target substrate, a plurality of anisotropic conductive adhesive being placed on the target substrate; and
    an adsorption device, the adsorption device comprising:
    a substrate; and
    a plurality of magnetic units on a surface of the substrate, the plurality of magnetic units being spaced apart from each other;
    wherein each of the plurality of magnetic units comprises a magnet and a cladding layer partially covering the magnet;
    the cladding layer is made of a magnetic material; and
    a side of the magnet away from the substrate is exposed from the cladding layer.

11. The transferring system of claim 10, wherein the cladding layer defines a through hole; the though hole extends through the cladding layer; the through hole comprises a first opening and a second opening opposite to the first opening; the magnet is in the through hole; the substrate covers one of the first opening and the second opening.

12. The transferring system of claim 11, wherein an inner diameter of the through hole gradually decreases from the first opening to the second opening;
    the substrate covers the first opening.

13. The transferring system of claim 12, wherein an outer diameter of the magnet gradually decreases in a direction from the first opening to the second opening to fit the through hole.

14. The transferring system of claim 11, wherein an inner diameter of the through hole is constant from the first opening to the second opening.

15. The transferring system of claim 11, wherein the magnet comprises a magnetic pole S and a magnetic pole N, one of the magnetic pole S and the magnetic pole N is closer to the first opening, and other of the magnetic pole S and the magnetic pole N is closer to the second opening.

16. The transferring system of claim 10, wherein the cladding layer is made of one or more selected from a group consisted of iron, cobalt, and nickel.

17. The transferring system of claim 10, wherein the cladding layer and the substrate are made of a same material.

18. A method for making an adsorption device, comprising:
    providing a plurality of magnets and a plurality of cladding layers, each of the plurality of cladding layers defining a through hole;
    positioning one of the plurality of the magnets into the through hole of each of the plurality of cladding layers; and
    providing a substrate and fixing the plurality of magnets and the plurality of cladding layers on a surface of the substrate.

* * * * *